(12) United States Patent
Hackl

(10) Patent No.: US 12,000,881 B2
(45) Date of Patent: Jun. 4, 2024

(54) METHOD FOR AUTOMATICALLY CREATING INSTALLATION-SPECIFIC MEASURING PROFILES FOR AN INSULATION MONITORING SYSTEM

(71) Applicant: Bender GmbH & Co. KG, Gruenberg (DE)

(72) Inventor: Dieter Hackl, Fernwald (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 18/089,735

(22) Filed: Dec. 28, 2022

(65) Prior Publication Data

US 2023/0236237 A1    Jul. 27, 2023

(51) Int. Cl.
*G01R 31/12*     (2020.01)
*G01R 1/02*      (2006.01)
*G06F 11/30*     (2006.01)

(52) U.S. Cl.
CPC ......... *G01R 31/1272* (2013.01); *G01R 1/025* (2013.01); *G06F 11/3013* (2013.01); *G06F 11/3093* (2013.01)

(58) Field of Classification Search
CPC .. G01R 1/025; G01R 27/025; G01R 31/1272; G06F 11/3013; G06F 11/3093; G05B 23/0256
See application file for complete search history.

(56) References Cited

U.S. PATENT DOCUMENTS

| | | | | |
|---|---|---|---|---|
| 2012/0119754 | A1* | 5/2012 | Brenk | G01R 31/52 |
| | | | | 324/551 |
| 2017/0176511 | A1* | 6/2017 | Moell | G01R 31/086 |
| 2018/0154776 | A1* | 6/2018 | Gardien | G01R 31/52 |
| 2020/0166556 | A1 | 5/2020 | Casey et al. | |
| 2021/0341542 | A1* | 11/2021 | Reitz | G01R 31/40 |

FOREIGN PATENT DOCUMENTS

| | | |
|---|---|---|
| DE | 102015225831 | 6/2017 |
| DE | 102016224459 A1 | 6/2017 |
| EP | 3467597 A1 | 10/2019 |
| EP | 3904896 A1 | 3/2021 |

OTHER PUBLICATIONS

European Search Report, dated May 17, 2023.
Europeam Patent Office, European Search Report (English Translation), dated Jun. 2, 2023.

* cited by examiner

*Primary Examiner* — Yoshihisa Ishizuka
(74) *Attorney, Agent, or Firm* — Warren D. Schickli; Stites & Harbison PLLC

(57) ABSTRACT

A method for automatically creating installation-specific measuring profiles for an insulation monitoring system, includes: assisting in a computer-controlled manner by means of an assist system via guided instructions for acquiring installation data; and executing the instructions by means of one more sensor devices. The method further includes pre-selecting, assisting, recording, evaluating, detecting, and optimizing steps.

16 Claims, 8 Drawing Sheets

Figure 1:
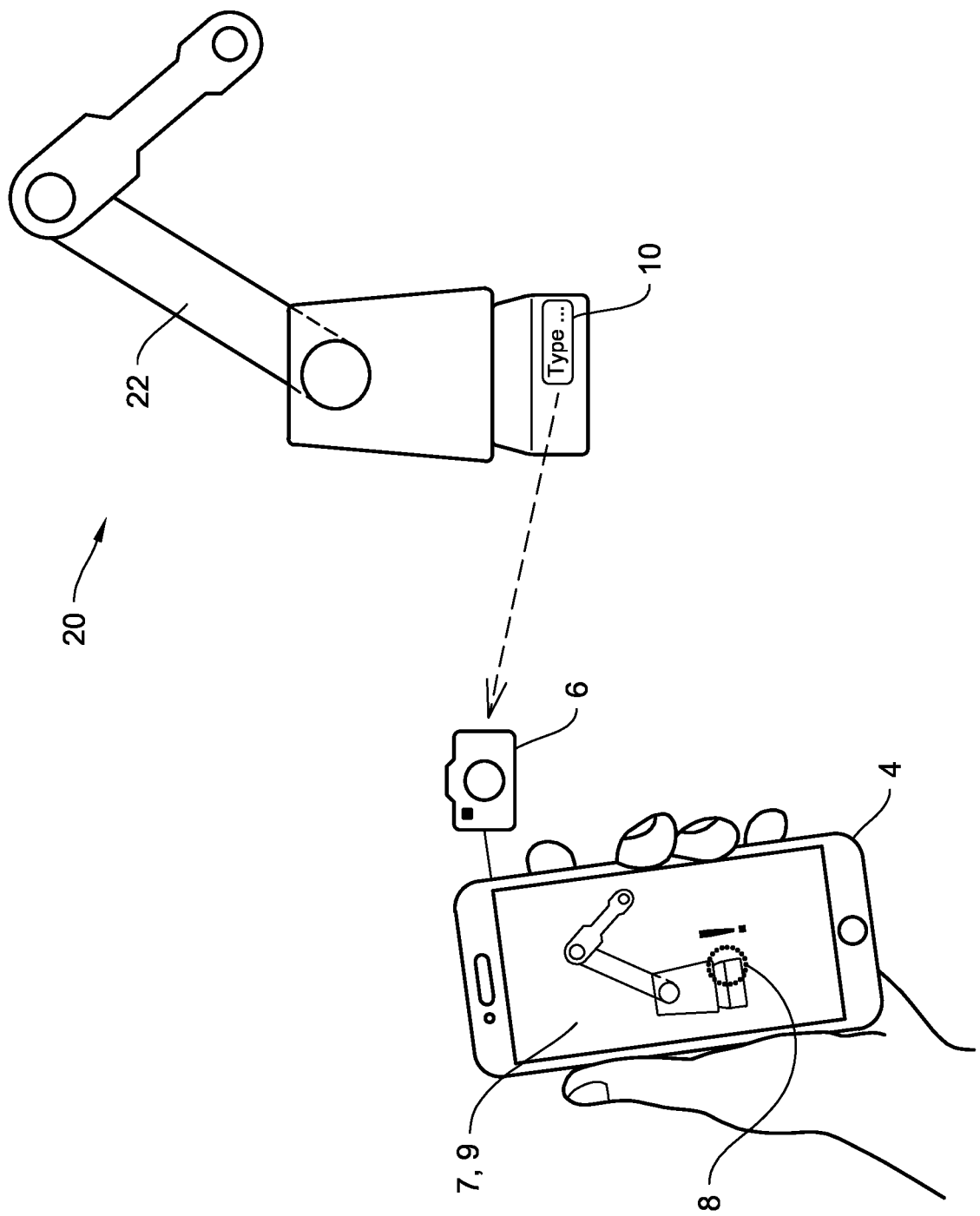

METHOD FOR AUTOMATICALLY CREATING INSTALLATION-SPECIFIC MEASURING PROFILES FOR AN INSULATION MONITORING SYSTEM

This National Stage application claims priority to German Patent Application No. 10 2021 006 389.9, filed Dec. 28, 2021, the entirety of the contents of which is incorporated by reference herein.

TECHNICAL FIELD

The invention relates to a method for automatically creating installation-specific measuring profiles for an insulation monitoring system of an electric installation.

BACKGROUND

According to standards DIN VDE 0100-410 and IEC 60364-4-41, an ungrounded power supply system (referred to as an electric installation in the following) is to be equipped with an insulation monitoring device (IMD) to monitor the insulation resistance of the electric installation and to signal the occurrence of a first fault between an active part of the electric installation and a body of electric equipment (fault to frame) or against ground (ground fault). The insulation monitoring devices available on the market specified in product standard IEC 61557-8 are available often in device variations for specific usages with regard to a certain use or can be configured for approximately 80% of the usages for a wider range of use with measuring profiles stored in the device.

Insulation monitoring systems available in the state of the art have proven disadvantageous in that customer-specific, i.e., installation-specific, measuring profiles having suitable measuring-profile parameters have to be created at great effort for usages with deviating requirements.

For instance, a general measuring principle must first be selected, such as imbalance methods or a pulse method, and sampling rates and filter cutoff frequencies and permissible disturbance limits must be determined as measuring-profile parameters for its digital implementation.

Setting the measuring-profile parameters therefore requires time and cost-intensive service calls from expert at the site of the customer's electric installation. The steps to be carried out manually by the expert for creating an installation-specific insulation-monitoring-device measuring profile on site commonly begin with analyzing the customer's installation in order to gather an overall understanding for the usage. This is followed by a detailed analysis of the operating states during regular operation of the electric installation and the diagnosis of the effects of disturbance variables on the insulation monitoring. By means of acquiring measured data, the measuring behavior of the insulation monitoring device is observed in order to conclude with determining adequate measuring-profile parameters which allow a suitable, disturbance-free insulation monitoring device use in the usage at hand.

An insulation monitoring device model which seems most suitable for the desired usage has hitherto been selected in a personnel and thus cost-intensive manner by distribution staff, service staff or product managers in order to subsequently adapt the insulation-monitoring-device measuring-profile parameters via this circle of people at significant time expenditure.

SUMMARY

The object of the invention at hand is therefore to describe a method which simplifies the steps to be carried out manually by experts for creating an installation-specific insulation-monitoring-device measuring profile at the site of the customer's electric installation and to make it less personnel, time and cost-intensive in comparison to the state of the art.

This object is attained by the features according to the invention of the method according to claim 1.

The fundamental idea of the invention at hand is based upon supporting the experts working at the customer's site, who are knowledgeable in the usage but do not have any further knowledge in the area of insulation monitoring technology, in such a manner that the customer's technical equipment, e.g., smartphones and tablet PCs including sensor technology installed therein, is made technically usable as an assist system for creating installation-specific insulation-monitoring-device measuring profile. For this purpose, the acting person receives instructions in a computer-controlled manner via the assist system for executing technical measures in order to be able to create installation-specific insulation-monitoring measuring profiles without the added support of an expert for insulation monitoring technology.

To carry out an analysis of the customer's electric installation, a computer-controlled assist takes place in a first step by means of the assist system via guided instructions for acquiring technical and non-technical installation data.

Via the assist system, the expert active at the customer's site is presented a sequence of instructions which instructs the person on acquiring technical data (physical variables) and non-technical data (typical installation parameters and technical information) of the electric installation including the insulation monitoring system installed in the installation.

According to the instructions specified by the assist system in a computer-controlled manner, the instructions are executed partially-automated and/or automated by means of one or more sensor devices in order to acquire installation data.

This data acquisition takes place outside of the regular operation in an optical, acoustic or general manner using acquisition sensor technology, which is capable of recording relevant objects (e.g., type plates or installed electric equipment) or occurring technical effects and physical variables (e.g., installation noise, vibration waveforms of moved machine parts or current propagation or voltage curves) for the analysis of the electric installation. For the partially automated execution of the instructions, the instructions for executing manual actions can take place conversationally in the sense of a user guidance.

Based on the thus acquired installation data, a computer-aided preselection of an available measuring profile takes place.

For this purpose, a best possible measuring profile stored in the insulation monitoring system can be selected, or the installation data is compared to contents in an installation databank to identify measuring profiles for insulation monitoring systems used successfully in comparable customer installations in a preselection.

In a subsequent step, computer-controlled assisting takes place by means of the assist system via guided instructions for operating the electric installation during regular operation with changing operating states using the preselected measuring profile with acquiring installation measured data and with synchronously recording the measuring behavior of the insulation monitoring system by means of storing insulation-monitoring-system measured data during regular operation.

In contrast to the installation data acquired in the first step which pertain to data which are gathered outside of the regular operation for analyzing the electric installation, the measured data describe those data which are acquired during regular operation, a difference being made between (general) installation measured data and (specific) insulation-monitoring-system measured data.

The instructions also specified in this step by the assist system lead the expert to execute a regular operation of the electric installation. For this purpose, all possible, in particular critical, operating states are passed with a periodically repeating sequence of these operating states such as they are to be expected during the production operation.

In addition to acquiring technical and non-technical installation data for analysis in the first step outside of the regular operation, installation measured data is now acquired during regular operation according to the positioned sensor technology—preferably where disturbance-relevant installation measured data is to be expected.

Thereby installation operating states distinguishable from each other are acquired with their corresponding installation measured data and the temporal sequence of the operating states. A possible disturbance influence of the insulation monitoring system associated with the corresponding operating state is recorded by means of storing insulation-monitoring-system measured data during regular operation by synchronously recording the measuring behavior of the insulation monitoring device.

Then, the measuring behavior of the insulation monitoring system is evaluated.

The evaluation of the measuring behavior, i.e., the observation and assessment of the reaction of the insulation monitoring system based on insulation-monitoring-system measured data recorded during regular operation, can yield the result of firstly a measuring profile having been determined via the preselection, the measuring profile leading to a satisfactory measuring behavior in all operating states and thus no disturbance influence of the insulation monitoring system taking place, or secondly of a measuring profile being found via the preselection which does not function disturbance-free in all operating states, or thirdly of a measuring profile having been determined via the preselection which does not lead to a satisfactory result in any of the operating states.

In the first case, the insulation monitoring works satisfactorily with the preselected measuring profile and the object can be deemed obtained.

In the second case, owing to the insulation monitoring functioning sufficiently reliably in most of the operating states, a strategy can consist of discarding the detected measured values in the critical operating states in order to avoid false alarms.

Should, however, the measuring behavior prove prone to disturbance in all or in the majority of the operating states, as is the case in case three, the disturbance variables are detected from the installation measured data.

For this purpose, disturbance-relevant signals of the sensor devices are analyzed in the detected installation measured data for each operating state with the aid of digital signal processing methods, such as digital filter or transformation algorithms, in order to determine the disturbance portions (disturbance variables) contained therein.

An electric disturbance variable can be marked by, for example, a noticeable current propagation or voltage curve (outliers), or the disturbance variable can be of mechanical nature and make itself noticeable via pronounced machine noise or machine vibrations. Using suitable sensor devices, the disturbance signals are detected and identified with the aid of digital signal processing.

Subsequently, the regular operation is simulated with the preselected measuring profile using the installation measured data afflicted with the disturbance variables.

A simulated insulation monitoring is executed with the preselected measuring profile and with the disturbance-variable-afflicted installation measured data based on the insulation monitoring system installed in the electric installation.

In conclusion, the preselected measuring profile is optimized by adapting measuring-profile parameters with regards to a disturbance-resistant insulation monitoring.

Using digital signal processing algorithms or by means of adaptive methods, the parameters of the preselected measuring profile is optimized such that the insulation monitoring system works disturbance-free in all operating states.

The optimization process takes place in a decentralized manner in the sensor device (edge computing), or the installation measured data and insulation-monitoring-system measured data are forwarded to a central server (cloud computing) via a network infrastructure, such as a radio network, for central evaluation, the transition between "edge" and "cloud" being smooth.

In another advantageous embodiment, the assist system is the installation operator's end device in the form of a smartphone, a tablet PC, a notebook, virtual reality glasses (VR glasses) or augmented reality glasses (AR glasses), and the computer-controlled assisting takes place by means of an application executable on the end device.

In terms of creating the installation-specific measuring profile in a task-oriented and personnel, cost and time-efficient manner, the installation operator's technology and sensor technology is reverted to. Preferably, mobile end devices are suitable for this purpose, assist applications available on the market ("app store") being installed as applications ("apps") on the installation operator's end device.

The wide availability and the increasing distribution of mobile end devices result in an increased efficiency of the method according to the invention in conjunction with the increasing digitization of industrial processes.

Advantageously, the computer-controlled assisting is supported by virtual reality methods (VR methods) and/or augmented reality methods (AR methods).

Using the VR and AR methods, the instructions and the acquired installation data, installation measured data and insulation-monitoring-system measured data can be directly visualized or projected at a desired position of the electric installation, meaning the instructed actions can be executed without any expert knowledge or further auxiliary means from experts.

Preferably, the installation data and the installation measured data is acquired by means of sensor devices installed in the assist system.

Since known, in particular mobile, end devices (smartphones) used as assist systems are for the most part already equipped with optical, acoustic or movement and haptic sensors, this sensor technology can be efficiently used for acquiring installation data and installation measured data.

Alternatively and additionally to the sensor technology already available in the assist system (end device)—as known from the state of the art—separate sensors installed in an electric machine and preferably connected via radio transmission can acquire the installation measured data.

When optimizing the preselected measuring profile by adapting measuring-profile parameters, methods of artificial intelligence (AI) are preferably employed.

Methods of artificial intelligence allow setting up decision-making rules for the optimization of the measuring-profile parameters in the present monitoring situation by identifying correlations in the data from the past, such as in available data from the insulation monitoring of similar electric installations.

Preferably, the installation measured data and the insulation-monitoring-system measured data are transmitted by means of a radio transmission path.

Via a radio interface available in the assist system, such as in the smartphone as the end device, installation measured data and insulation-monitoring-system measured data are transmitted to a central computing unit (server) in order to create a measuring profile optimized for the installation operating states for the insulation monitoring system with the aid of insulation-monitoring simulations and AI applications and to test the measuring profile by means of the bidirectional radio transmission path.

The radio transmission path can be a wireless local network (WiFi) or a mobile network (5G standard).

The analysis, simulation and optimization processes do not necessarily have to be executed on the assist system (the installation operator's smartphones), but can instead be transmitted to a suitable computing infrastructure (server) in the background by means of the radio transmission path and run there.

The monitoring task of the insulation monitoring system is attained when measuring profile solutions functioning without disturbance have been found for a sufficient number of operating states during regular operation of the electric installation.

Further advantageous design features are derived from the following description and the drawings which describe a preferred embodiment of the invention using examples.

BRIEF DESCRIPTION OF THE DRAWING FIGURES

Figure 2:
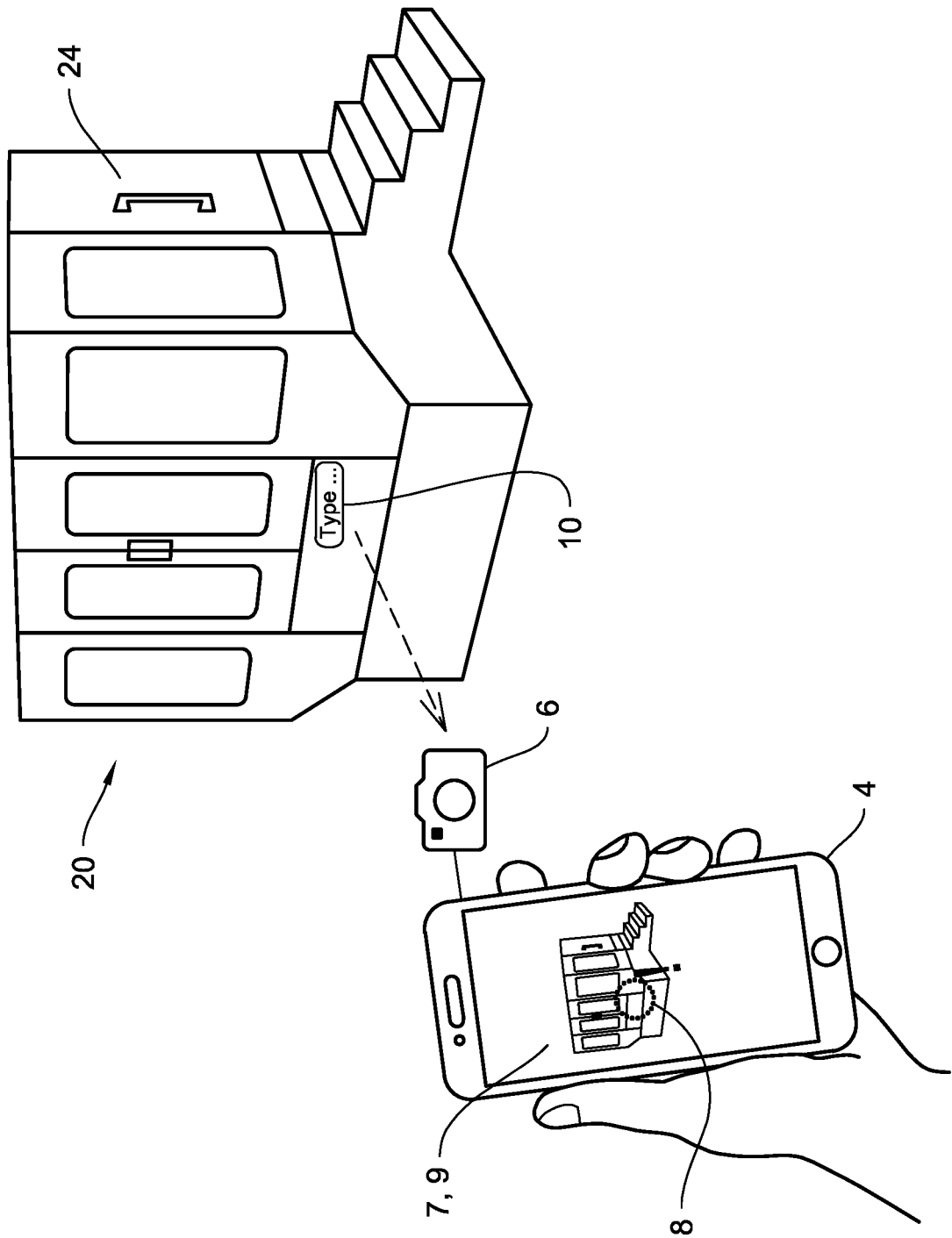
Figure 3:
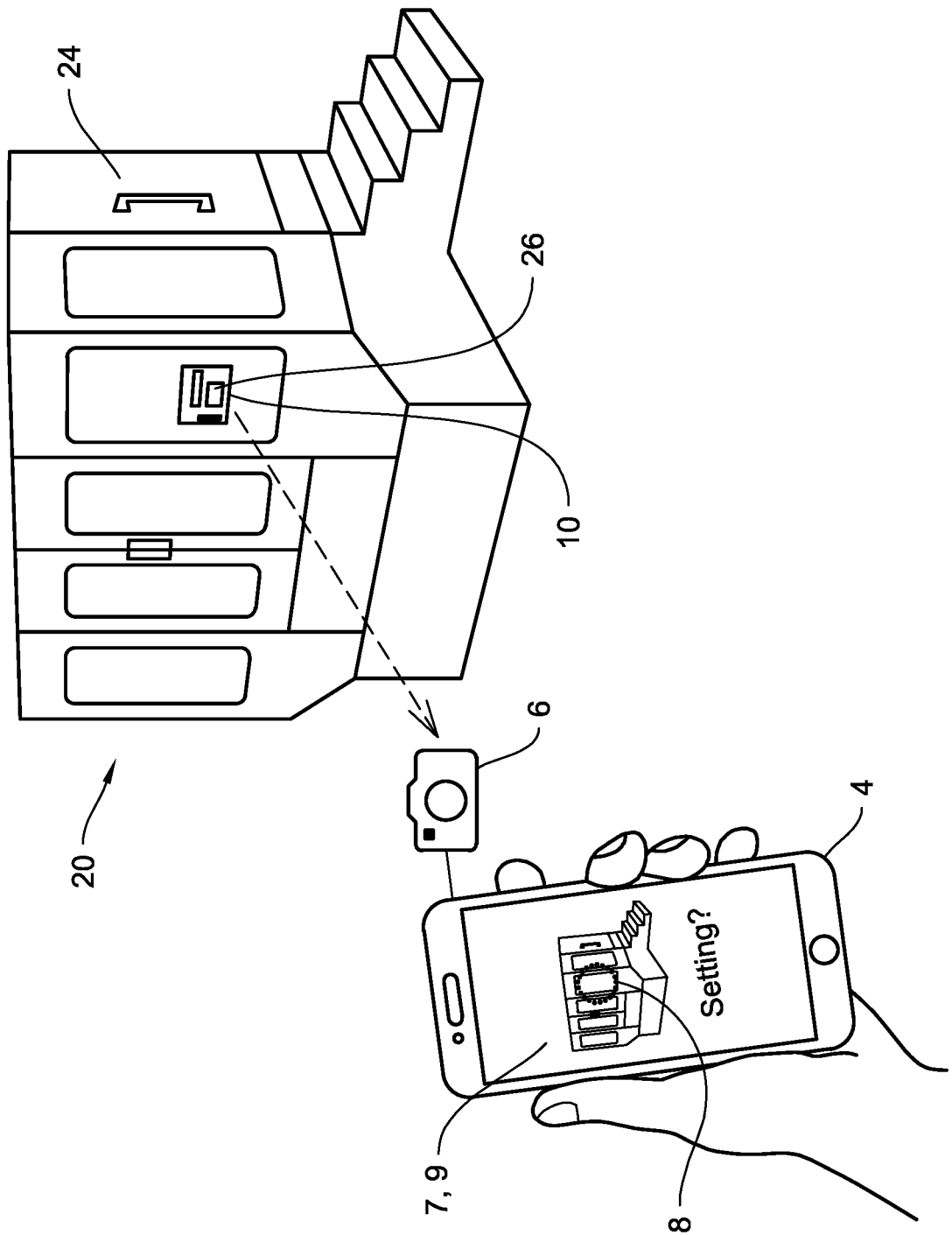
Figure 4:
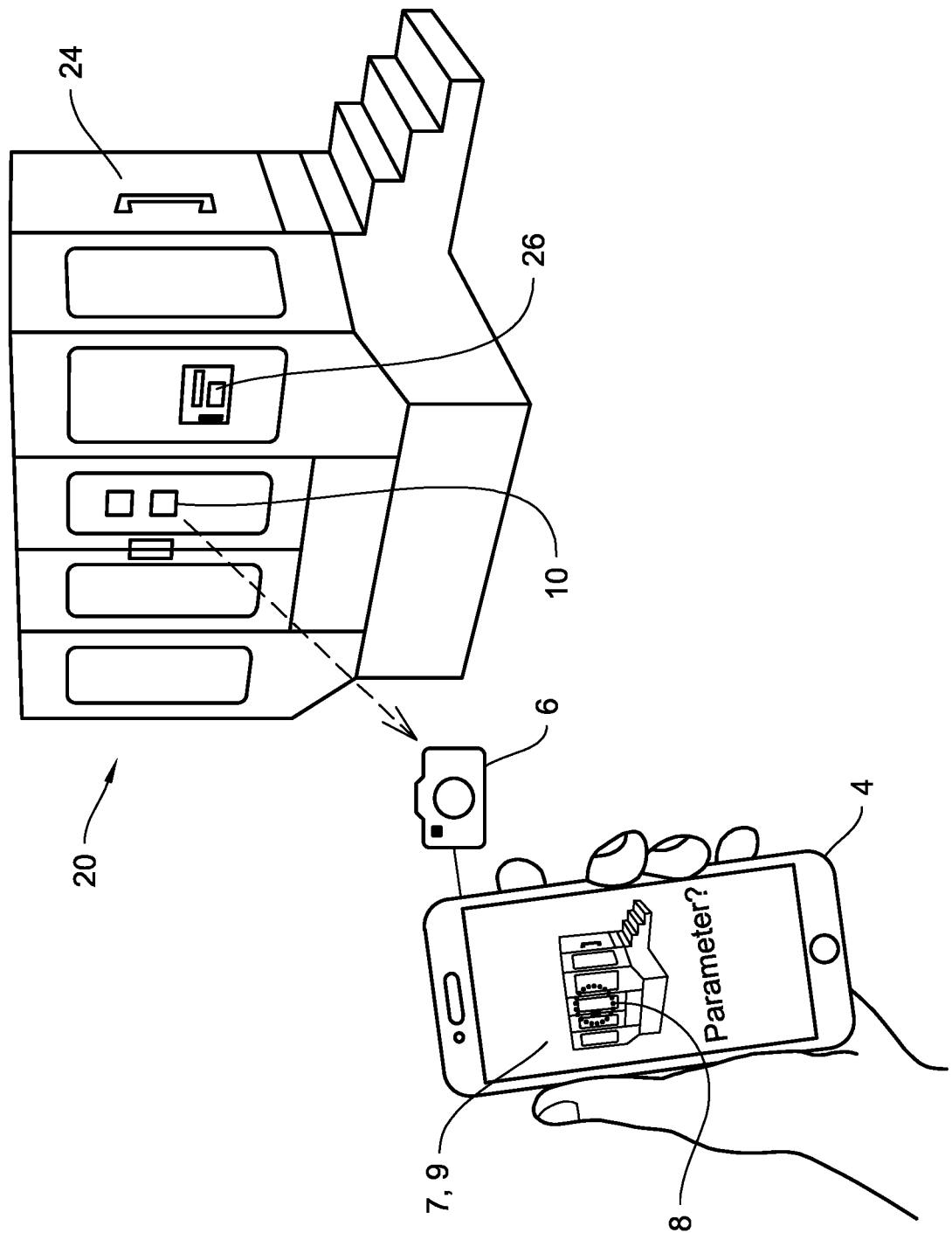
Figure 5:
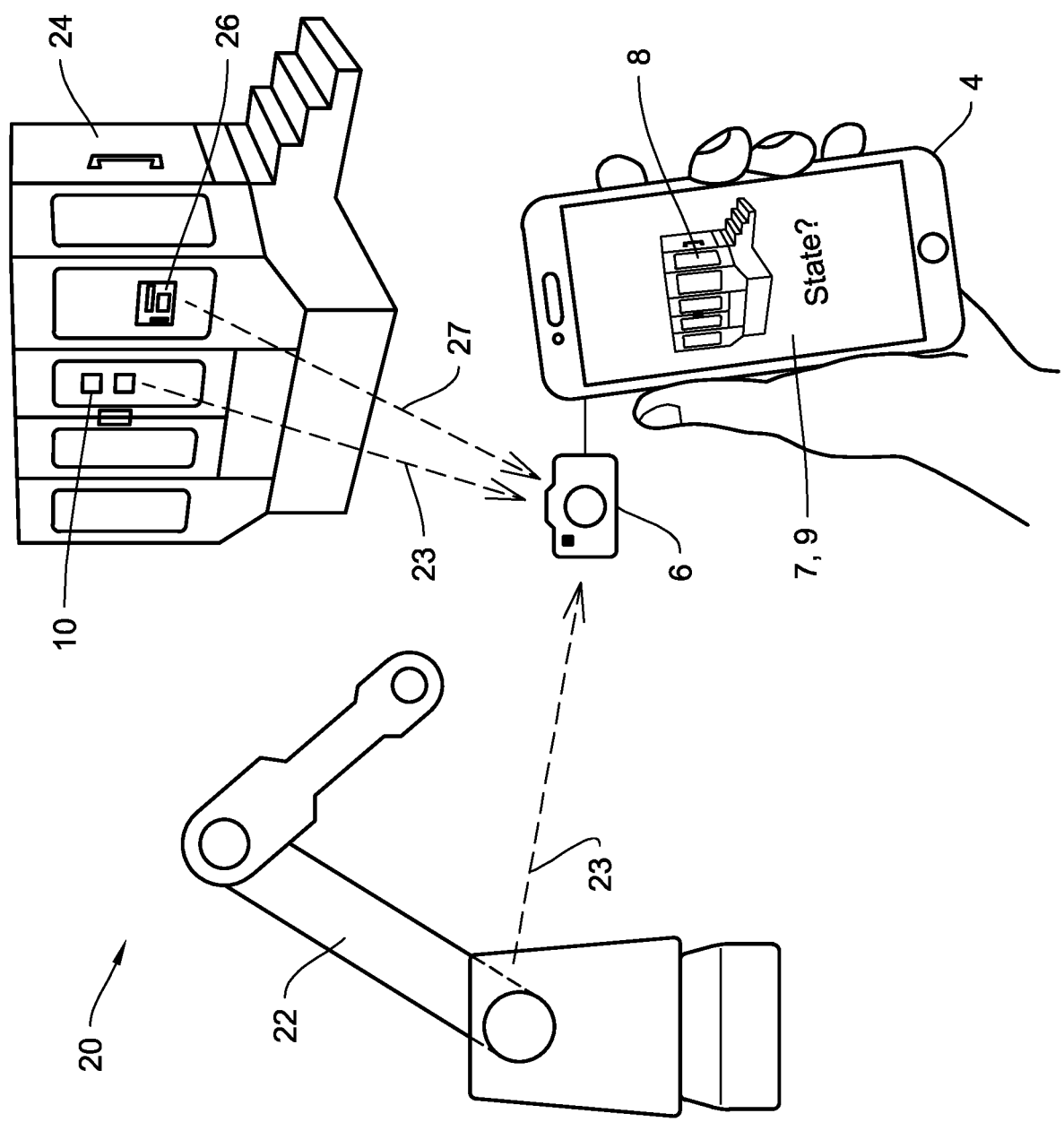
Figure 6:
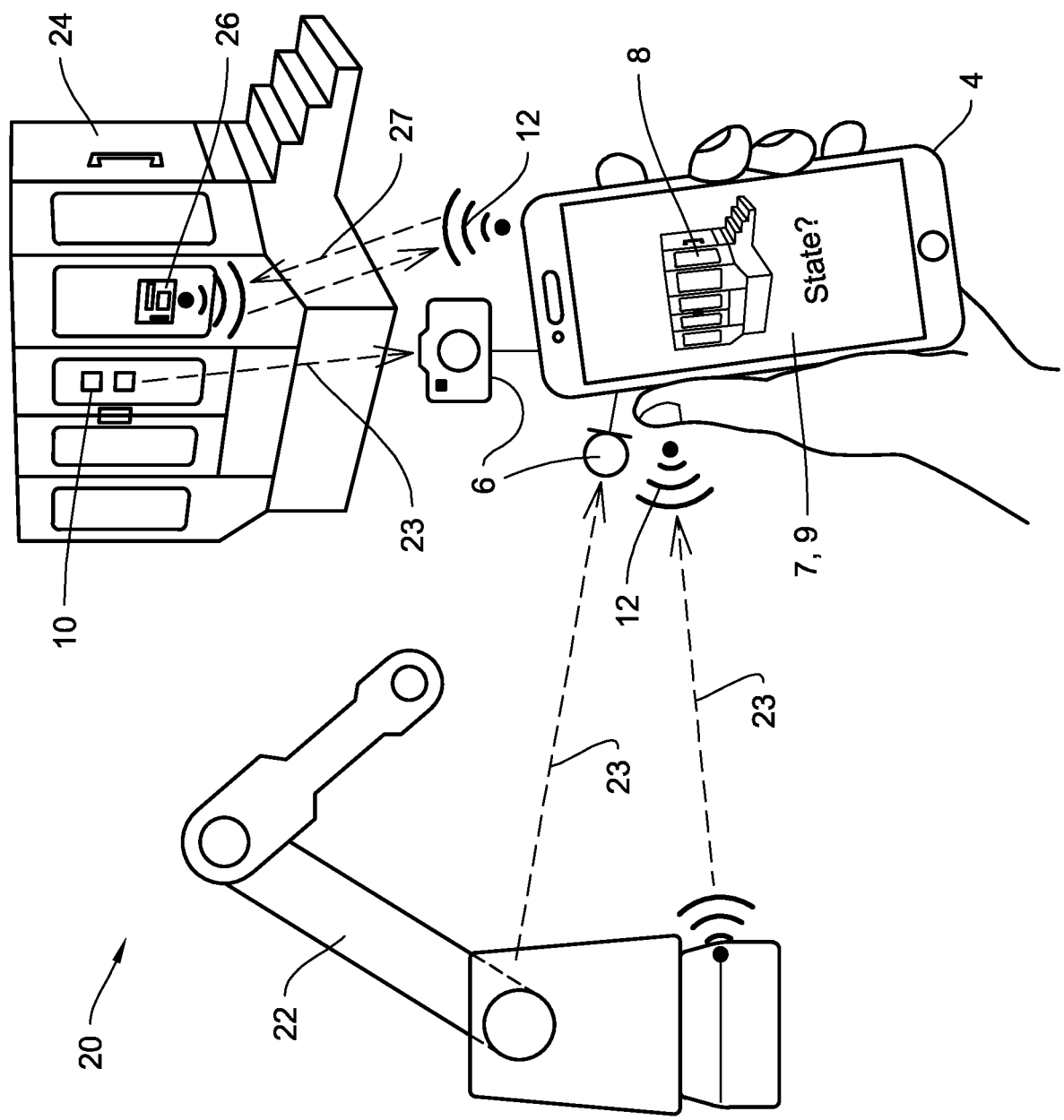
Figure 7:
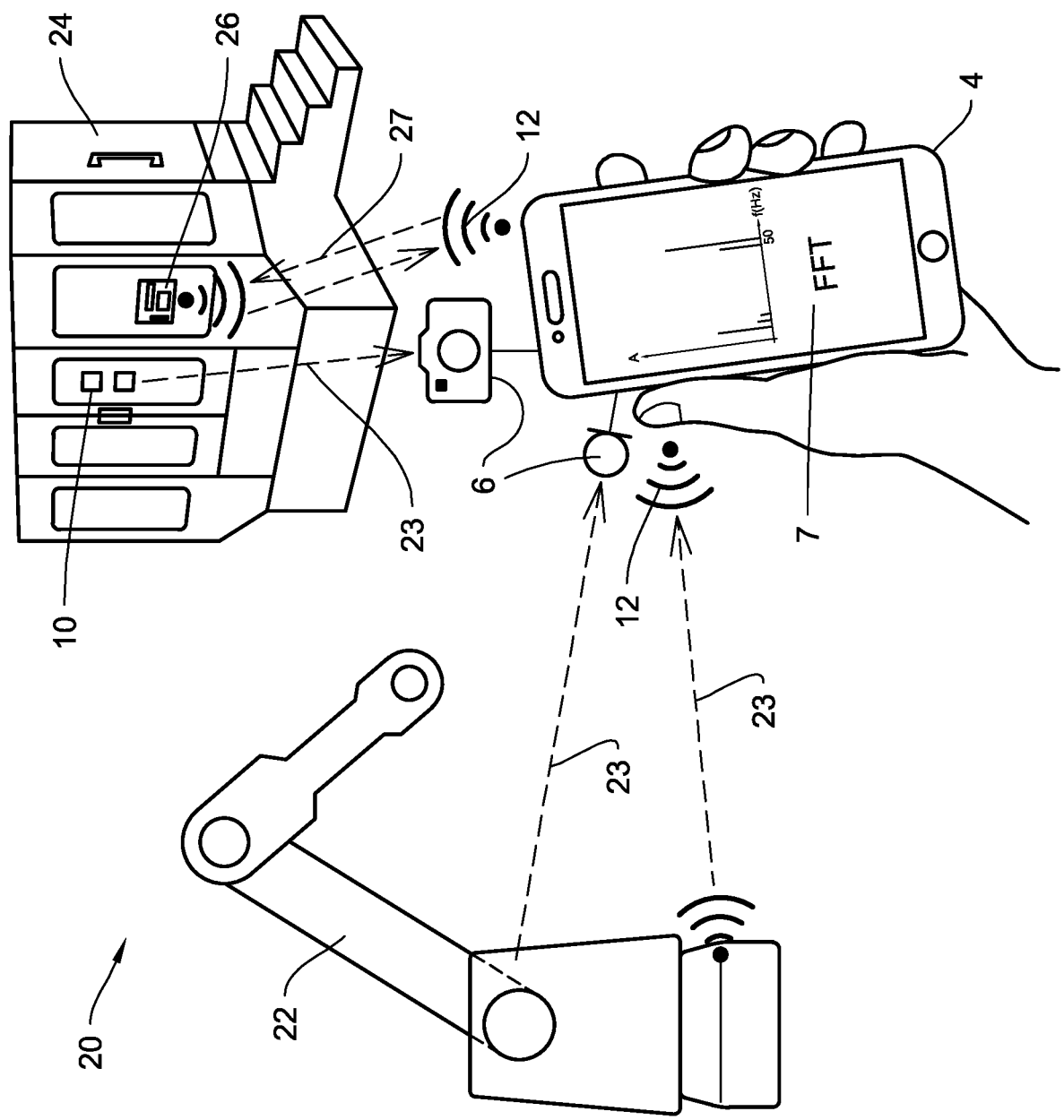
Figure 8:
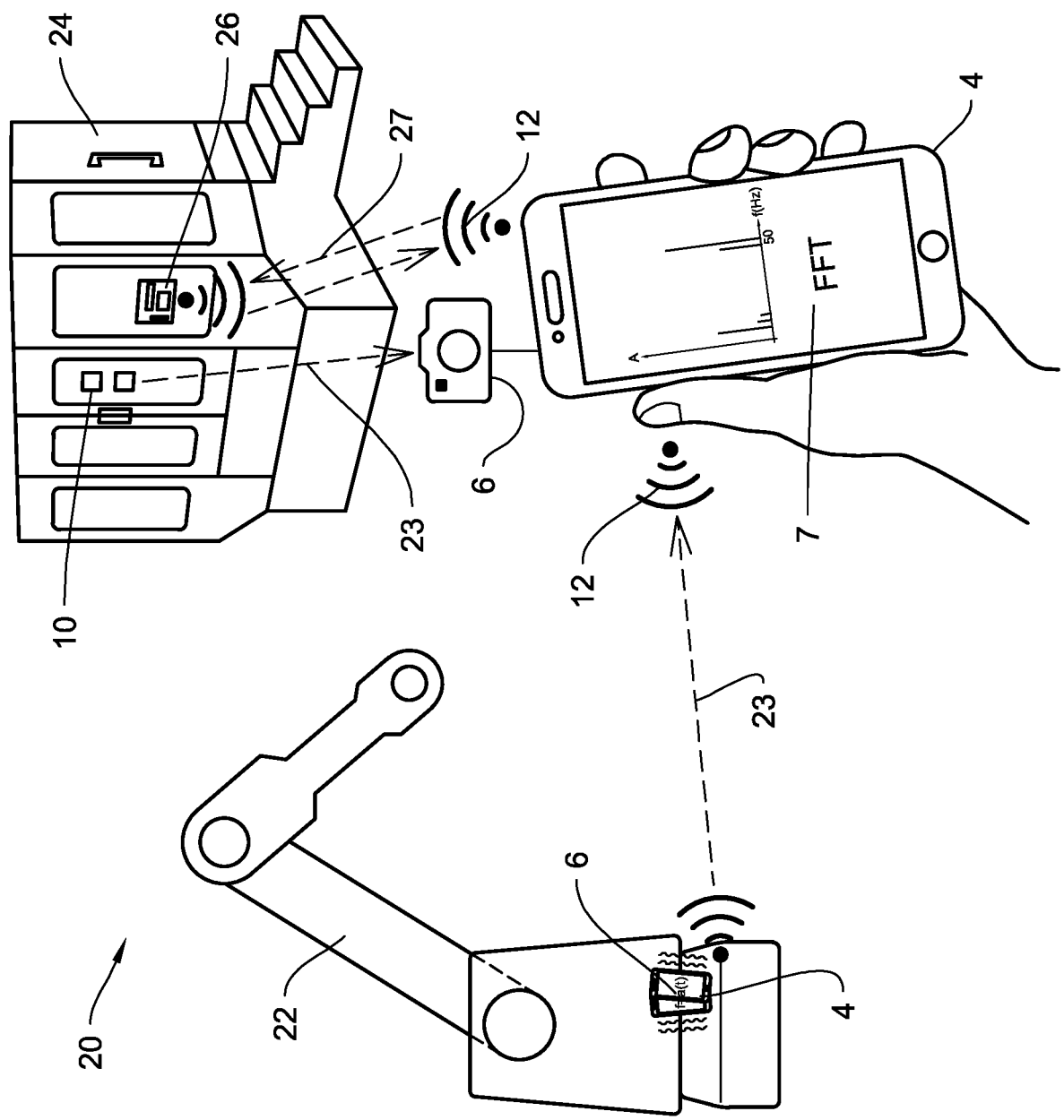

FIG. 1 shows a computer-controlled acquisition of installation data—image acquisition of a type plate of an industrial robot, FIG. 2 shows a computer-controlled acquisition of installation data—image acquisition of a type plate of a control cabinet, FIG. 3 shows a computer-controlled acquisition of installation data—image acquisition of settings of the insulation monitoring system, FIG. 4 shows a computer-controlled acquisition of installation data—image acquisition of installation data, FIG. 5 shows a computer-controlled acquisition of installation measured data and insulation-monitoring-system measured data—image acquisition of operating states and measuring behavior, FIG. 6 shows a computer-controlled acquisition of installation and insulation-monitoring-system measured data with radio transmission, FIG. 7 shows a detection of disturbance variables by means of sensor devices and digital signal processing, and FIG. 8 shows a detection of disturbance variables by means of a second mobile end device and digital signal processing.

DETAILED DESCRIPTION

FIG. 1 shows an electric installation 20 having an electric machine 22 designed as an industrial robot 22.

On industrial robot 22, a type plate is affixed, on which relevant parameters of industrial robot 22 are marked as installation data 10. Using a camera as sensor device 6 of an assist system 4 designed as a smartphone, these installation data 10 are acquired. For this purpose, an application 7 is installed on smartphone 4, application 7 guiding the user on acquiring installation data 10 via computer-controlled and user-guided verbal and visual instructions 9 on the screen of smartphone 4. Instructions 9 are supported by an AR method 8.

FIG. 2 shows a control cabinet 24 as another component of electric installation 20, one or more type plate(s) having installation data 10 of the devices, such as an insulation monitoring system 26 (FIG. 3), installed in control cabinet 24 being affixed in control cabinet 24.

These installation data 10 are acquired according to instructions 9 of employed application 7 and supported by an AR method 8 using camera 6 of assist system 4 (smartphone).

From installation data 10 contained on the type plates, in particular the type designation, or from the image acquisition of an open control cabinet 24, important installation properties can be derived.

In particular, settings of insulation monitoring system 26 installed in control cabinet 24 are recorded as installation data 10 using camera 6, as shown in FIG. 3.

In the face of the analysis of electric installation 20, the (parameter) settings of insulation monitoring system 26 are identified with regards to the creation, in particular when preselecting a measuring profile, under the guidance of application 7 using instructions 9 and supported by AR method 8.

FIG. 4 shows in the same manner the acquisition of further installation data 10 of electric equipment installed in control cabinet 24 using camera 6 of assist system 4.

FIG. 5 shows the computer-controlled acquisition of installation measured data 23 and the acquisition of insulation-monitoring-system measured data 27 during regular operation of electric installation 20.

Using camera 6 of assist system 4, both installation measured data 23 of industrial robot 22 and of the devices installed in control cabinet 24 and insulation-monitoring-system measured data 27 of insulation monitoring system 26 are acquired according to instructions 9.

In FIG. 6, the computer-controlled acquisition of installation measured data 23 and insulation-monitoring-system measured data 27 is shown during regular operation in conjunction with radio transmission path 12.

For this purpose, two separate radio transmission paths 12 are installed between industrial robot 22 and assist system 4 and between insulation monitoring system 26 and assist system 4. Preferably, this radio transmission 12 is based on a WiFi standard or a mobile radio standard.

By means of radio transmission path 12 between industrial robot 22 and assist system 4, the operating states of industrial robot 22 passed during regular operation of installation 20 are transmitted with the associated installation measured data 23 from a sensor of industrial robot 22 equipped with a radio module to assist system 4 in order to detect disturbance variables.

Additionally, installation measured data 23 can be recorded acoustically in the corresponding operating state using a microphone as sensor device 6 of assist system 4.

By means of radio transmission path 12 between insulation monitoring system 26 and assist system 4, insulation-monitoring-system measured data 27 are transmitted to assist system 4 for evaluating the measuring behavior of insulation monitoring system 26.

This radio transmission path 12 can also be used to preselect in a computer-supported manner and test different measuring profiles already available in insulation monitoring system 26 in a specific operating state and to evaluate the behavior of insulation monitoring system 26 using the correspondingly preselected measuring profile. This course of action is suitable to select the already available measuring profile which is the best possible one for this installation operating state.

FIG. 7 shows the identification of disturbance variables from the acquired installation measured data 23 by means of digital signal processing algorithms, which are implemented on assist system 4 as application 7.

For this purpose, a microphone is used as sensor device 6 of assist system 4 in order to detect disturbance components mostly generated by low-frequency load fluctuations and relevant to the measuring function of insulation monitoring system 26, for example by means of a Fast Fourier Transformation (FFT as application 7).

Via radio transmission path 12, installation measured data 23 can transmitted alternatively or additionally to assist system 4.

FIG. 8 shows the detection disturbance variables by means of a second mobile end device 5 having an acceleration sensor 5 as sensor device 6 on industrial robot 22.

To record a certain operating state having a specific movement sequence of industrial robot 22, another assist system 5 designed as a second mobile end device 5 is disposed on industrial robot 22. Second mobile end device 5 (smartphone) is equipped with an acceleration sensor as sensor device 6.

In other usage cases, a magnetic-field sensor could be used near a power supply cable in order to detect critical disturbance components. In the usage environment of blast furnaces, the usage of an infrared sensor of the smartphone camera also seems sensible in order to identify critical load fluctuations.

Via radio transmission path 12 originating from second mobile end device 5, acceleration data are transmitted as installation measured data 23 of industrial robot 22 to assist system 4 and evaluated there by means of application 7, for example a FFT.

What is claimed is:

1. A method for automatically creating installation-specific measuring profiles for an insulation monitoring system of an electric installation, the method comprising:
   assisting in a computer-controlled manner by means of an assist system via guided instructions for detecting technical and non-technical installation data, and
   partially automatically and/or automatically executing the guided instructions for acquiring the technical and non-technical installation data by means of one more sensor devices,
   preselecting in a computer-aided manner a measuring profile based on the acquired technical and non-technical installation data,
   assisting in a computer-aided manner by means of the assist system via the guided instructions for operating the electric installation during regular operation with changing operating states using the preselected measuring profile with installation measured data, and with synchronously recording a measuring behavior of the insulation monitoring system by means of storing insulation-monitoring-system measured data during regular operation,
   evaluating the measuring behavior of the insulation monitoring system, detecting disturbance variables from the installation measured data if the measuring behavior proves to be prone to disturbances, and
   simulating regular operation with the preselected measuring profile using the installation measured data afflicted with the disturbance variables, and subsequently
   optimizing the preselected measuring profile by adapting measuring-profile parameters with regard to a disturbance-resistant insulation monitoring.

2. The method according to claim 1,
   wherein the assist system is an end device of an installation operator in the form of a smartphone, a tablet PC, a notebook, virtual reality glasses or augmented reality glasses, and computer-controlled assisting takes place by means of an application executable on the end device.

3. The method according to claim 2,
   wherein the computer-controlled assisting is supported by virtual reality methods and/or augmented reality methods.

4. The method according to claim 3, including acquiring the technical and non-technical installation data and the installation measured data by means of sensor devices installed in the assist system.

5. The method according to claim 4, including optimizing the preselected measuring profile by adapting measuring-profile parameters, using artificial intelligence.

6. The method according to claim 5, including transmitting the installation measured data and the insulation-monitoring-system measured data by means of a radio transmission path.

7. The method according to claim 1,
   wherein computer-controlled assisting is supported by virtual reality methods and/or augmented reality methods.

8. The method according to claim 7, including acquiring the technical and non-technical installation data and the installation measured data by means of sensor devices installed in the assist system.

9. The method according to claim 8, including optimizing the preselected measuring profile by adapting measuring-profile parameters, using artificial intelligence.

10. The method according to claim 9, including transmitting the installation measured data and the insulation-monitoring-system measured data by means of a radio transmission path.

11. The method according to claim 1, including acquiring the technical and non-technical installation data and the installation measured data by means of sensor devices installed in the assist system.

12. The method according to claim 11, including optimizing the preselected measuring profile by adapting measuring-profile parameters, using artificial intelligence.

13. The method according to claim 12, including transmitting the installation measured data and the installation-monitoring-system measured data by means of a radio transmission path.

14. The method according to claim 1, including optimizing the preselected measuring profile by adapting measuring-profile parameters, using artificial intelligence.

15. The method according to claim 14, including transmitting the installation measured data and the installation-monitoring-system measured data by means of a radio transmission path.

16. The method according to claim 1, including transmitting the installation measured data and the installation-monitoring-system measured data by means of a radio transmission path.

* * * * *

UNITED STATES PATENT AND TRADEMARK OFFICE
CERTIFICATE OF CORRECTION

| | | |
|---|---|---|
| PATENT NO. | : 12,000,881 B2 | |
| APPLICATION NO. | : 18/089735 | |
| DATED | : June 4, 2024 | |
| INVENTOR(S) | : Dieter Hackl | |

It is certified that error appears in the above-identified patent and that said Letters Patent is hereby corrected as shown below:

On the Title Page

In the first Column, item (30) insert:
--Foreign Application Priority Data
Dec. 28, 2021 (DE) ........................ 10 2021 006 389.9--.

In the Specification

In Column 7, Line 54, insert --or-- between "one" and "more".

In the Claims

In Column 8, Claim 13 (Lines 58-59), replace "installation-monitoring-system" with "insulation-monitoring-system".

In Column 8, Claim 15 (Lines 65-66), replace "installation-monitoring-system" with "insulation-monitoring-system".

In Column 9, Claim 16 (Lines 2-3), replace "installation-monitoring-system" with "insulation-monitoring-system".

Signed and Sealed this
First Day of October, 2024

Katherine Kelly Vidal
*Director of the United States Patent and Trademark Office*